(12) United States Patent
Kondo et al.

(10) Patent No.: US 6,774,447 B2
(45) Date of Patent: Aug. 10, 2004

(54) PACKAGE HAVING AN OPENING IN A SURFACE THEREOF FOR MOUNTING A SOLID STATE IMAGE SENSOR

(75) Inventors: Masayuki Kondo, Sodegaura (JP); Fumiya Miyata, Tokyo (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/425,614

(22) Filed: Apr. 30, 2003

(65) Prior Publication Data

US 2003/0209787 A1 Nov. 13, 2003

(30) Foreign Application Priority Data

May 7, 2002 (JP) ........................................ 2002-131540

(51) Int. Cl.⁷ ........................ H01L 27/148; H01L 23/56; H01H 23/48
(52) U.S. Cl. ........................ 257/432; 257/433; 257/434; 257/680; 257/737; 257/738; 257/778; 257/435; 257/291; 257/431; 257/444; 257/81; 257/98; 257/99
(58) Field of Search ................................. 257/431–435, 257/680, 737, 738, 778, 291, 444, 81, 98, 99, 673, 668, 273, 341, 774, 721, 728, 602, 215, 704, 786

(56) References Cited

U.S. PATENT DOCUMENTS

| | | | | |
|---|---|---|---|---|
| 5,555,334 A | * | 9/1996 | Ohnishi et al. | ................ 385/93 |
| 5,699,073 A | * | 12/1997 | Lebby et al. | .................. 345/82 |
| 6,040,612 A | * | 3/2000 | Minami et al. | ............. 257/432 |
| 6,396,116 B1 | * | 5/2002 | Kelly et al. | .................. 257/432 |
| 6,495,895 B1 | * | 12/2002 | Peterson et al. | ............. 257/434 |
| 6,569,698 B2 | * | 5/2003 | Wang et al. | .................. 438/26 |
| 2002/0105002 A1 | * | 8/2002 | Ono | ............................. 257/81 |
| 2003/0094665 A1 | | 5/2003 | Haazono | |

FOREIGN PATENT DOCUMENTS

| EP | 1 289 281 A1 | 3/2003 |
|---|---|---|
| JP | 2002-204400 A | 7/2002 |
| JP | 2002-280535 A | 9/2002 |
| JP | 2003-168793 A | 6/2003 |

* cited by examiner

Primary Examiner—Alexander Oscar Williams
(74) Attorney, Agent, or Firm—Burns, Doane, Swecker & Mathis, L.L.P.

(57) ABSTRACT

The package for mounting a solid state image sensor is a box-type resin package having in its bottom surface an opening for allowing light to pass so that a solid state image sensor may be mounted face down there. In the package, a three-dimensional circuit is formed which has a lead comprising a conductive metal plate making electrical conductance possible. The top surface of the inner lead of the lead is exposed on the inside bottom surface in the vicinity of the opening, and the top surface of the outer lead and the edge of the lead, following a bent section of the lead, are exposed on the side wall top surface of and the top edges of the side wall side surface of the aforesaid box-type resin package, respectively, with all the parts of the lead other than the exposed parts of both ends being embedded in the resin. Because of this, a small, thin package for mounting a solid state image sensor can be manufactured at low cost by using a simple process.

4 Claims, 7 Drawing Sheets

Fig. 1  CONVENTIONAL

Fig. 2  CONVENTIONAL

PACKAGE HAVING AN OPENING IN A SURFACE THEREOF FOR MOUNTING A SOLID STATE IMAGE SENSOR

BACKGROUND OF THE INVENTION

1. Field of the Invention

The present invention relates to a resin package with a three-dimensional circuit formed therein which is used for mounting face down a solid-state image sensor such as a CCD (charge couple device) and a CMOS (complementary MOS) device.

2. Description of the Background Art

Figure 1:
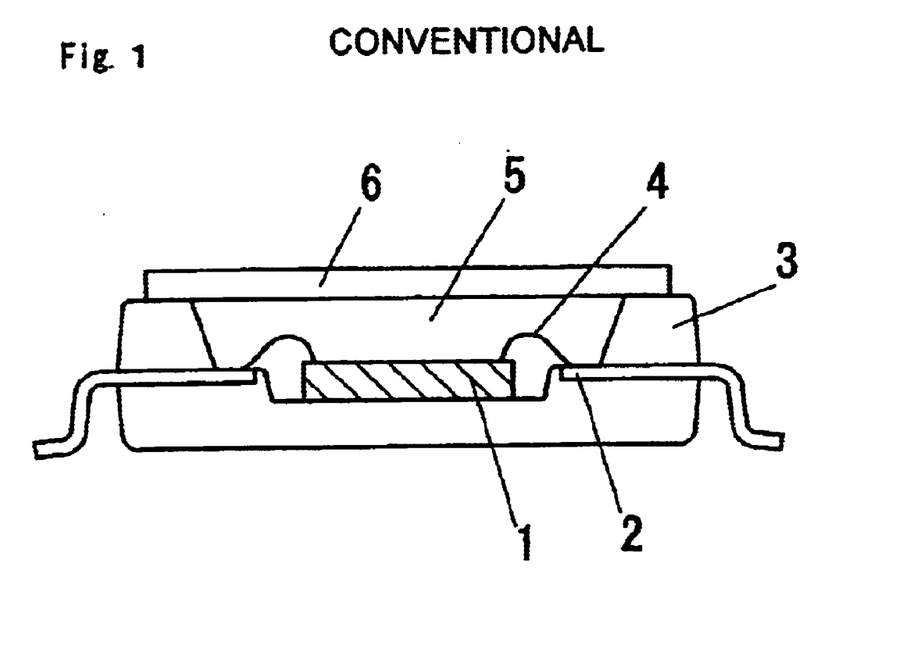
FIG. 1 is a cross sectional view showing the conventional hollow package.

In the past, a hollow resin package as illustrated in FIG. 1 has been used for the package for mounting a solid-state image sensor. After a solid-state image sensor 1 is mounted in the hollow section 5 of this hollow resin package, the inner lead 2 and the solid-state image sensor 1 are electrically connected by bonding them by means of thin wire 4 such as gold wire, and a transparent lid 6 is bonded to the top surface of the resin section 3 so that the hollow section 5 is hermetically sealed.

Figure 2:
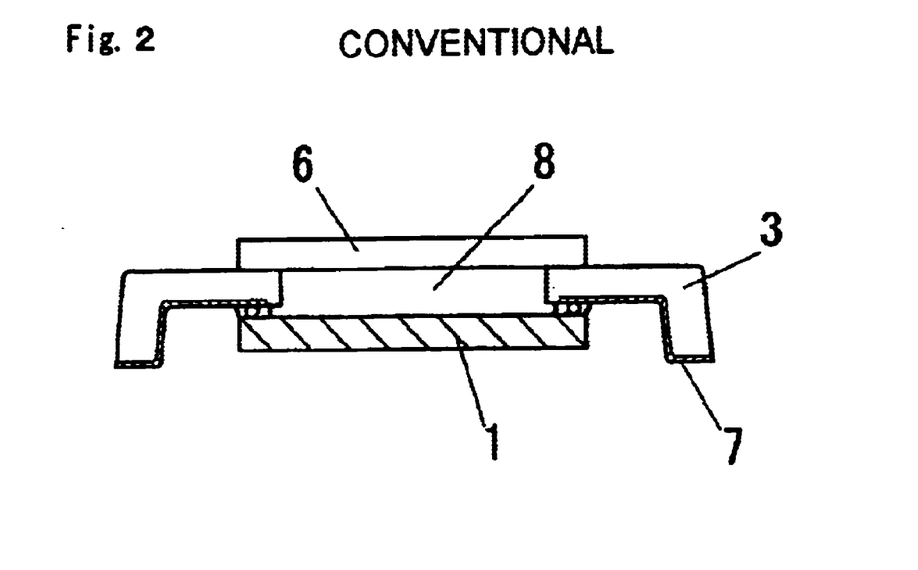
FIG. 2 is a cross sectional view of a device in which a solid-state image sensor has been mounted on a molded article prepared by the MID technique.

On the other hand, as there has been a growing demand in recent years for a smaller and thinner package for housing a solid-state image sensor, various methods are beginning to be used under which a solid-state image sensor is mounted in the form of a bare chip. Among such methods is a box-type molded article obtained by making use of the MID (molded interconnect device) technique, a three-dimensional circuit forming technology as illustrated in FIG. 2. Under this method, after a molded article having an opening 8 in the bottom of a box is molded by the injection molding method, a circuit 7 is formed on a surface of the resin section 3 inside the aforesaid box-type molded article, and then a solid-state image sensor 1 is mounted face down onto the circuit 7 formed near the opening 8. Japanese Laid-open Patent Publication No. 2002-280535 gives a description of a technique using a box having an opening in its bottom and a lens tube as an integral part of the box. The integral part is called the lens mounting seat, and the Japanese Laid-open Patent Publication proposes a technique of forming a wiring pattern by plating it directly onto the bottom of the lens mounting seat.

In this case, there are many methods based on the MID technique available for forming a circuit on the resin surface. For example, in the case of the 2-shot method, a resin on which a circuit can be formed is injection-molded first, and then after the molded article is set in another mold, the outer shape is over-molded. After that, the surface of the resin on which a circuit can be formed is subjected to plating so that a circuit is formed. Furthermore, the one-shot method is another method for forming a circuit, under which the deposition of a thin copper coating on the resin surface by means of sputtering or the application of a thin copper coat to the resin surface by means of electroless plating is followed by resist coating, exposure/development, copper etching, resist removal and then plating of nickel or gold onto the area in which a circuit has been formed.

Aside from the method of forming a circuit in the aforesaid box-type molded article, a different method is proposed as described in Japanese Laid-open Patent Publication No. 2002-204400 under which a circuit pattern of an image module with lens is formed by means of a lead frame.

SUMMARY OF THE INVENTION

The conventional hollow package made of resin tends to be large and thick overall because it is so structured that a solid-stage image sensor is mounted in the hollow package which is hermetically sealed by means of a transparent lid. Because of this, this form of package is beginning to fail to meet the recent demand for a smaller and thinner package. In addition to that, since the image sensor and the inner lead are bonded by means of gold wire, the light reflected diffusely at the bonding wire enters the image sensor, causing the distortion of the image in some cases.

On the other hand, the method under which a solid-state image sensor is mounted face down in a molded article on the surface of which a three-dimensional circuit has been formed by the MID technique does not need such box as used in a hollow package because a bare chip is mounted, offering the advantage of making the package as a whole smaller and thinner. Furthermore, since there is no bonding by means of gold wire, there is no occurrence of diffused reflection at the wire, which in turn causes no occurrence of a distorted image.

However, the method under which a three-dimensional circuit is formed in a resin molded article by the MID technique requires that in the case of the 2-shot method, two molds should be used and the resin surface should be roughened after the resin on which a circuit can be formed is molded in the first shot so that the adhesive strength of the resin interface is improved. On the other hand, under the 1-shot method, only one mold is required, but the process for forming a circuit involves many steps, such as thin coat plating, resist coating, exposure/development, copper etching, and resist removal. Both of these methods have a disadvantage of high manufacturing cost due to the complex processes.

In addition, Japanese Laid-open Patent Publication No. 2002-204400 proposes a method under which a modular circuit for an image sensor with lens is formed by use of a lead frame. But this method requires that after completion of insert molding, the outer lead should be bent complexly to follow the periphery of the box-type molded article because the lead has not been bent in advance.

With the objective of resolving the above problems experienced in producing a small and thin solid-state image sensing device, the present invention relates to a box-type package made of resin for mounting a solid-state image sensor in which a three-dimensional circuit is formed. The box-type resin package comprises a resin section and a lead embedded in the resin section. The resin section has a bottom surface with an opening for allowing light to pass so that a solid state image sensor may be mounted face down on the bottom surface. In the package, a three-dimensional circuit is formed which has a lead formed from a conductive metal plate making electrical conductance possible. The lead has an inner lead, an outer lead, and a bent lead section. The top surface of the inner lead is exposed on the inside bottom surface in the vicinity of the opening, and the top surface of the outer lead and the edge of the outer lead following a bent section of the lead are exposed on the side wall top surface of the resin section and the top edge of the side wall side surface of the resin section, respectively, with all the parts of the lead other than the exposed surfaces and edge of both ends being embedded in the resin section.

The aforesaid conductive metal plate can be formed into a circuit in the box-type resin package by bending three-dimensionally a lead frame generally used in semiconductor encapsulation. Under this technique, a three-dimensional circuit is formed by use of a lead frame, and therefore this technique does not require going through a complex process such as the MID method, making the formation of a circuit possible at low cost. Specifically, a resin package for a solid-state image sensor can be obtained easily by setting in a mold a lead frame having a three-dimensional structure with the lead in a bent condition, carrying out resin molding and then cutting off the lead protruding from the surface of the edge of the resin molded article to separate it from the lead frame after the thin resin flashes remaining on the lead surface are removed.

The aforesaid solid-state image sensor to be mounted in the box-type resin package is a light-receiving type semiconductor device such as CCD and CMOS.

Furthermore, the resin for use in the molding of the box-type resin package is preferably a thermosetting resin such as epoxy resin, phenol resin, polyimide resin, unsaturated polyester resin and silicone resin or heat-resistant thermoplastic resins such as liquid-crystal polymer, polyphenylene oxide, polyphenylene sulfide (PPS) resin, polysulfone and polyamide-imide-polyacrylsulphone resin. Out of these, epoxy resin, polyimide resin, PPS, etc. are especially preferable. For polyimide resin, polyaminobismaleimido, polypyromelliteimide and polyimide resin such as polyether may be used.

An inorganic filler is preferably added to these heat-resistant resins. Examples of such inorganic filler include heat-resistant inorganic fillers such as silica powder, alumina powder, silicon nitride powder, boron nitride powder, titanium oxide powder, silicon carbide powder, glass fiber and alumina fiber. Out of these, silica powder, alumina powder, silicon nitride powder and boron nitride powder are more preferable because the use of such inorganic filler will cause shrinkage after the molding of the resin package to be isotropic. The particle size of such inorganic filler is preferably 0.1 to 120 $\mu$m, more preferably 0.5 to 60 $\mu$m from the viewpoint of flowability at the time of molding. Such inorganic filler is added to heat-resistant resin in the amount of preferably 40 to 3,200 parts by weight, more preferably 100 to 1,150 parts by weight, to 100 parts by weight of the heat-resistant resin. Further, the heat resistant resins may contain a hardener, a hardening accelerator and a coupling agent in addition to these inorganic fillers.

The lead is provided in the form of a lead frame and is selected from among copper, iron, aluminum and any alloy of these. The lead is preferably formed from 42 alloy or copper alloy. The surface of the lead frame does not need to be treated but may be treated totally or partially as required. For example, the lead frame may be plated with gold, silver, nickel, solder, etc.

In the aforesaid Figures, Symbol 1 represents a solid-state image sensor; Symbol 2, the inner lead; Symbol 3, the resin section; Symbol 4, gold wire; Symbol 5, the hollow section; Symbol 6, a transparent lid; Symbol 7, the circuit section; Symbol 8, the opening; Symbol 9, a lead frame; Symbol 10, the outer lead; Symbol 11, the bent lead section; Symbol 12, the side wall surface; Symbol 13, the top surface of the side wall; Symbol 14, the inside bottom surface at the opening; Symbol 15, the outside bottom surface at the opening; Symbol 16, a cylindrical holder; Symbol 17, a body tube; Symbol 18, the protruding electrode; Symbol 19, encapsulating liquid-state resin, Symbol 20, a lens tube; and Symbol 21, a fixing ring.

DESCRIPTION OF THE PREFERRED EMBODIMENTS

A description will be given of the preferred embodiments of the present invention on the basis of the Figures.

Figure 3:
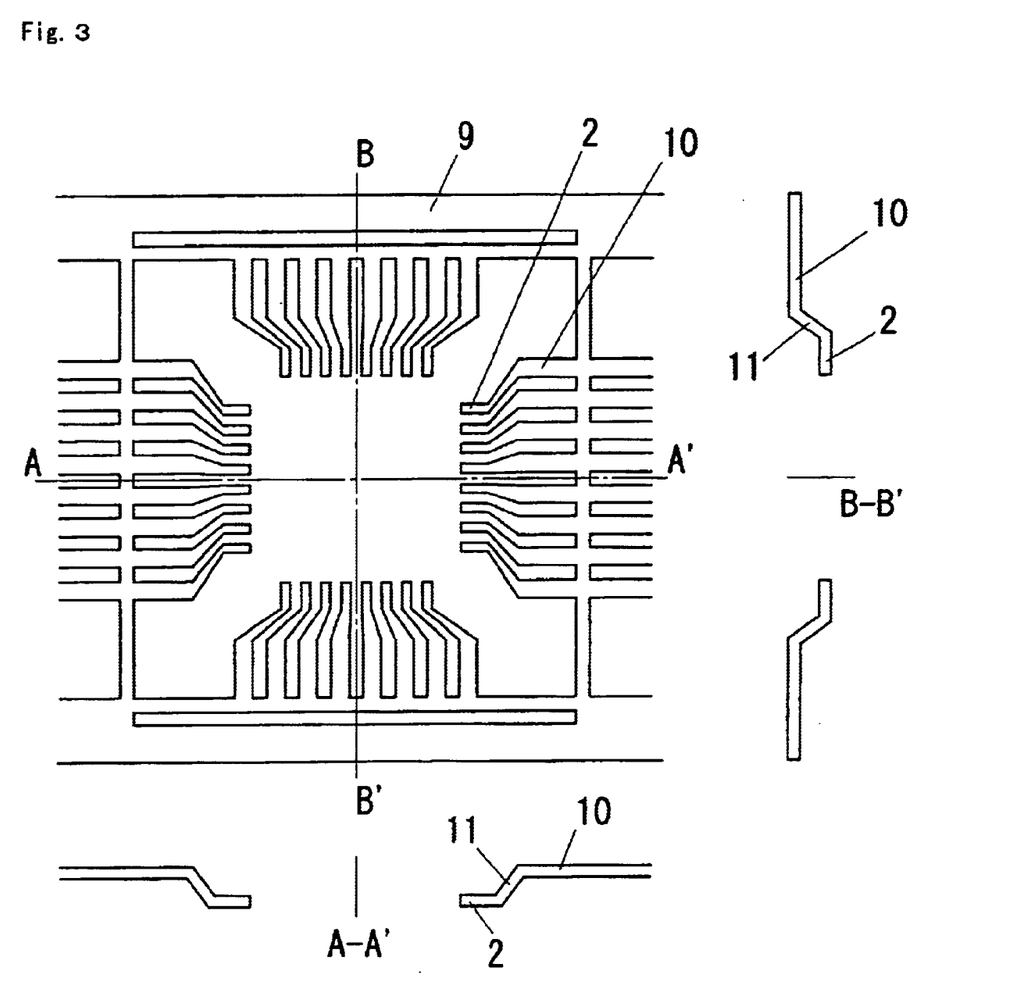
FIG. 3 is plan and cross sectional views of the lead frame having leads in four directions that is used in the present invention.

First, lead frame 9 having leads in four directions as shown, for example, in FIG. 3 is prepared. Lead frame 9 can be prepared by machining a thin metal plate comprising 42 alloy or copper alloy to an intended shape. Lead frame 9 is bent to provide bent lead section 11, which is at an intermediate level between inner lead 2 and outer lead 10 as shown in FIG. 3. Further, this form of lead arrangement may be used for the lead frame having leads in two directions as shown by the examples in FIG. 4 and FIG. 5.

Figure 4:
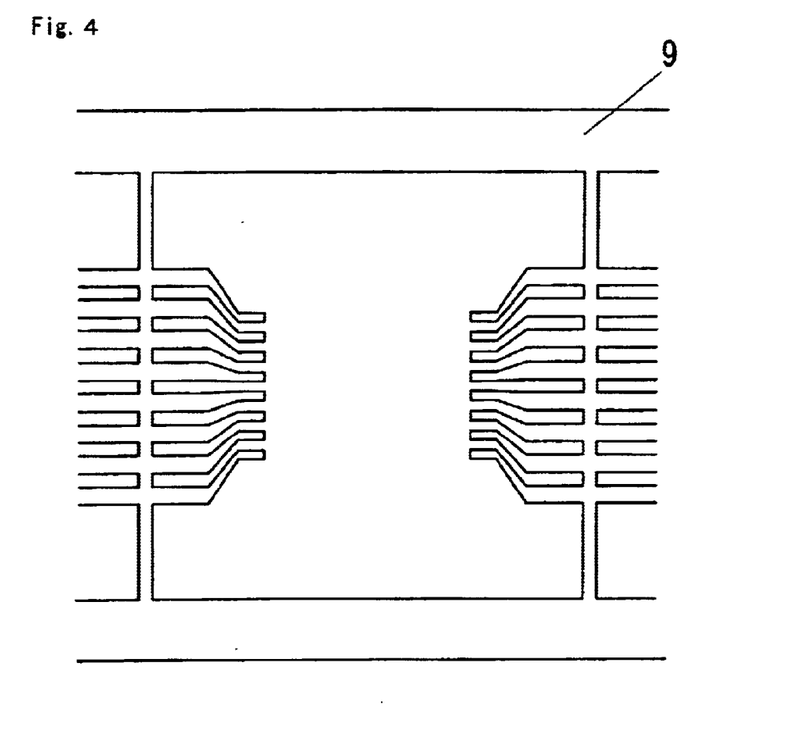
FIG. 4 is a plan view of a lead frame having leads in two directions that is used in the present invention.
Figure 5:
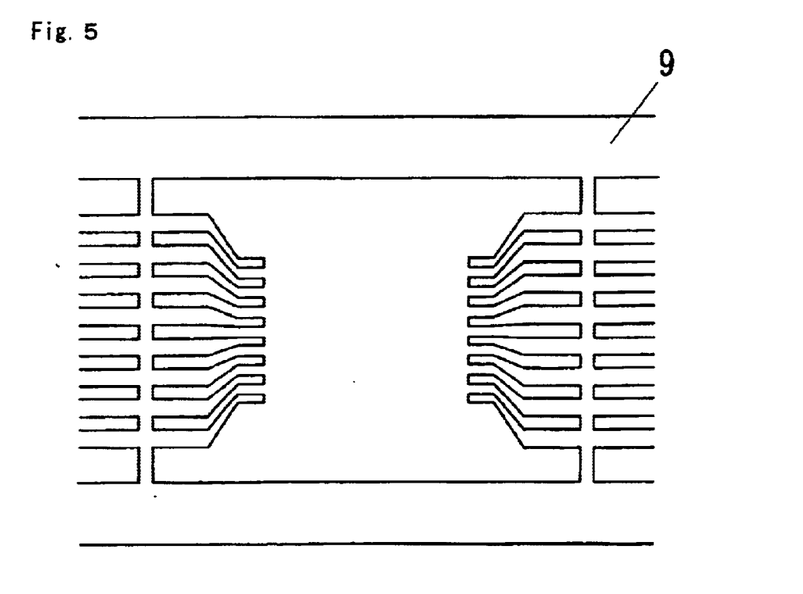
FIG. 5 is a plan view of another lead frame having leads in two directions that is used in the present invention.
Figure 6:
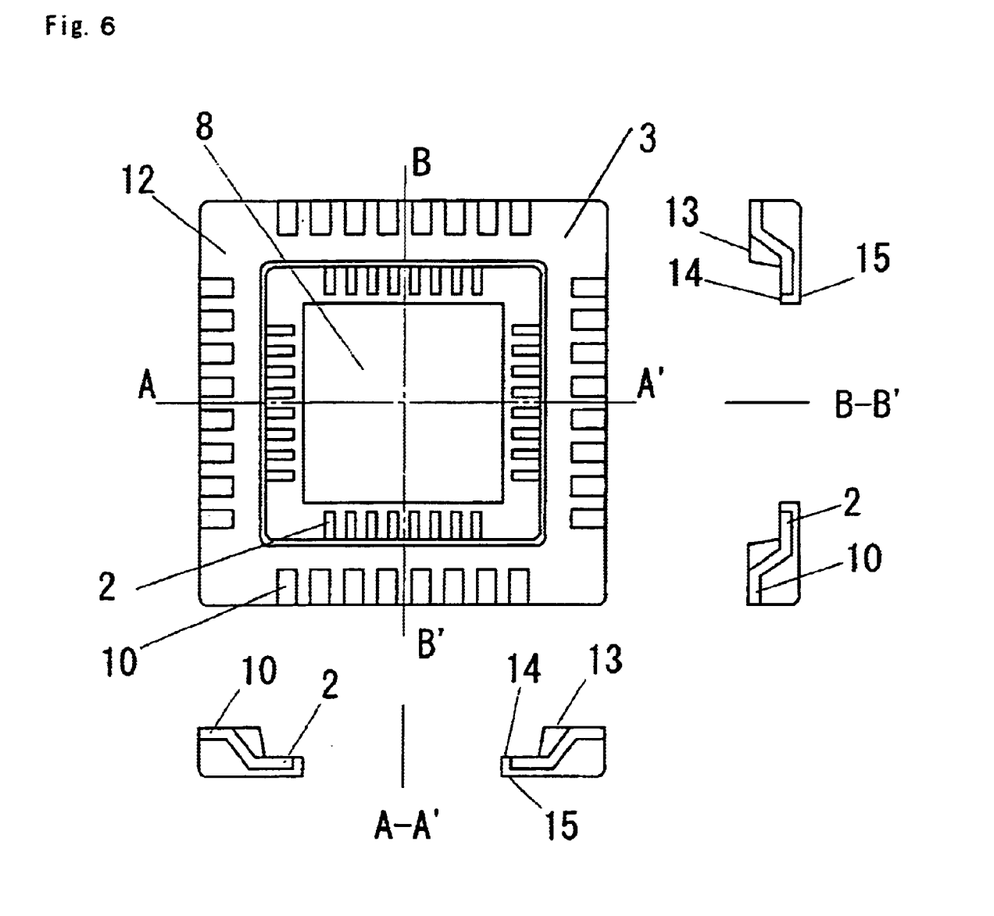
FIG. 6 is plan and cross sectional views of the box-type resin package relating to the present invention using the lead frame shown in FIG. 3.
Figure 7:
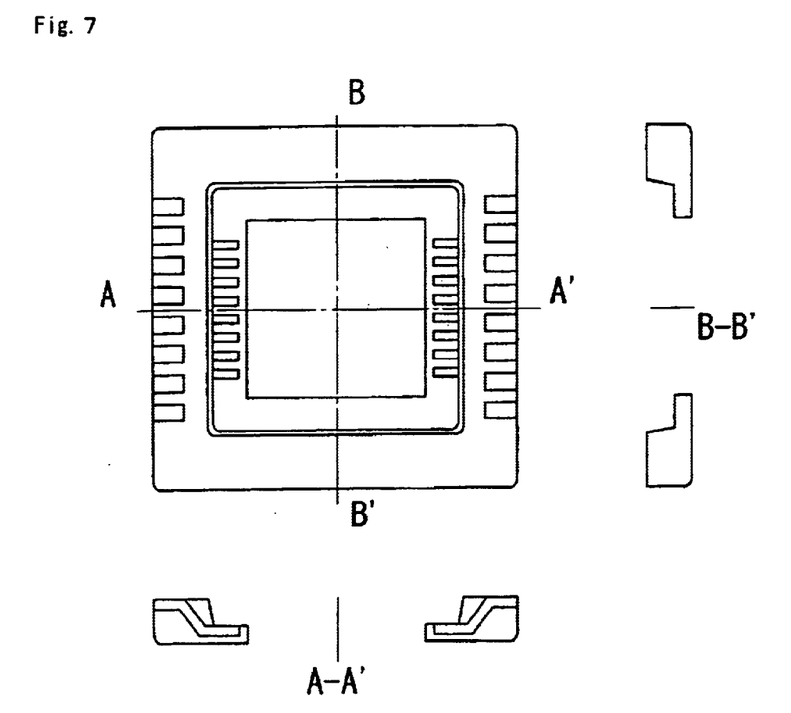
FIG. 7 is plan and cross sectional views of the box-type resin package relating to the present invention using the lead frame shown in FIG. 4.
Figure 8:
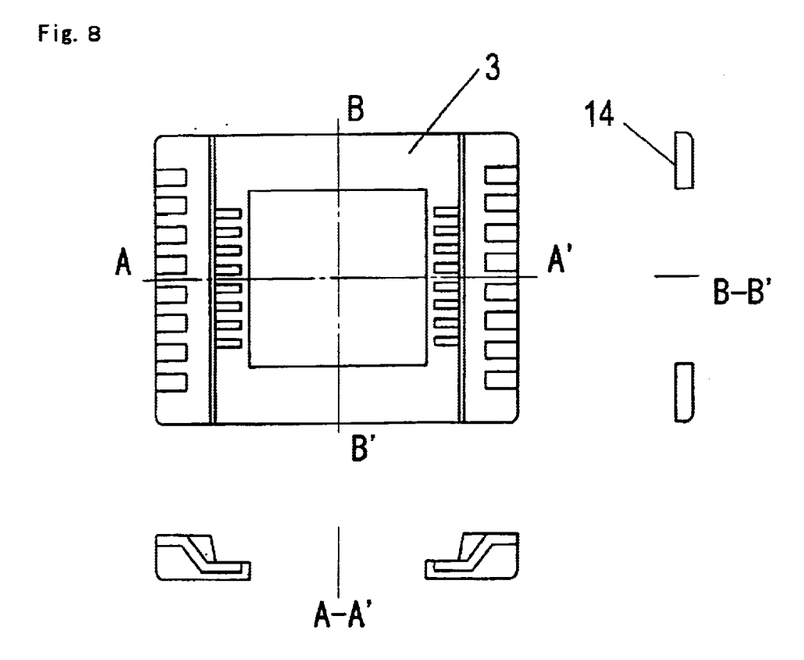
FIG. 8 is plan and cross sectional views of the box-type resin package relating to the present invention using the lead frame shown in FIG. 5 which does not have 2 opposed side walls.
Figure 9:
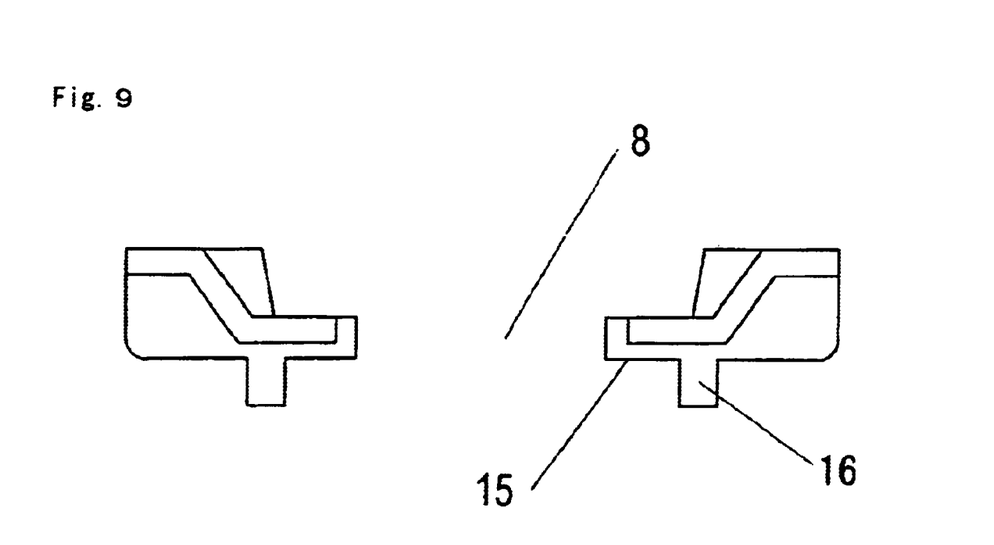
FIG. 9 is a cross sectional view of a resin package relating to the present invention which has a cylindrical holder on the side of the outside bottom surface of the opening.
Figure 10:
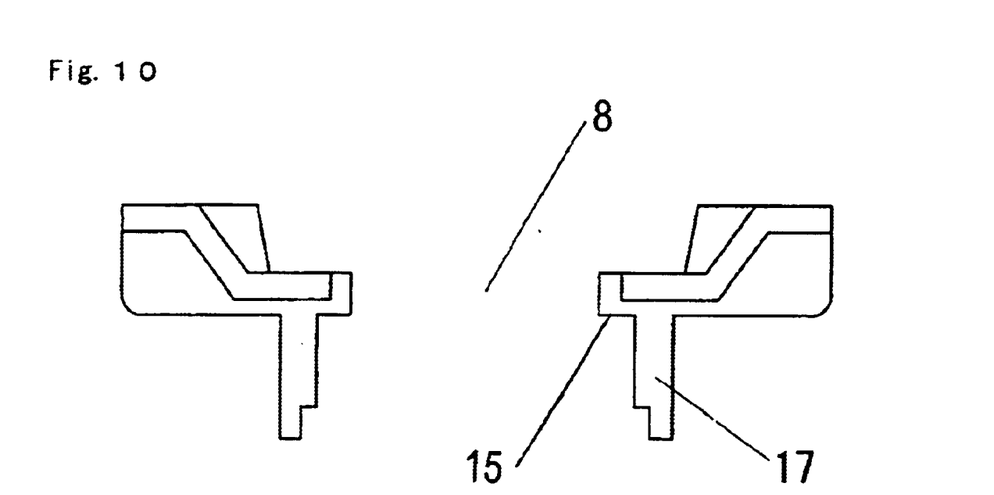
FIG. 10 is a cross sectional view of a resin package relating to the present invention which has a body tube attached to the side of the outside bottom surface at the opening.

Next a box-type resin package as shown in FIG. 6, for example, is formed by using lead frame 9 as shown in FIG. 3. In the case of a lead frame 9 having leads in two directions as shown in FIG. 4, a box-type resin package as illustrated in FIG. 7 is formed. Furthermore, in the case of using a lead frame 9 as shown in FIG. 5 and a mold not having two vertically oriented opposed side walls rising from the inside bottom surface 14 of two sides of the box-type shape, a resin package as shown in FIG. 8 is formed. In the case of the package shape as shown in FIG. 8, it becomes possible to reduce the outside size of the package to such extent that two sides of the box-type shape of the resin section 3 do not have two vertically oriented opposed side walls, compared with the package shape as shown in FIG. 7. Moreover, if a mold that allows a cylindrical holder to be formed on the side of the outside bottom surface 15 at the opening 8 is used in molding a box-type resin package, it is possible to form a resin package having a cylindrical holder 16 on the side of outside bottom surface 15 at the opening 8 as shown in FIG. 9. Further, it is also possible to form a resin package as shown in FIG. 10 if a mold having a shape of a body tube 17 for mounting a lens on the side of the outside bottom surface 15 at the opening 8 is used.

The molding of these resin packages can be accomplished by mounting lead frame 9 in a mold and carrying out insert molding by transfer-molding or injection-molding epoxy resin or the like in the cavity of the mold. Conditions for such transfer molding differ with the resin used, but in the case of transfer-molding epoxy resin as taken as an example, pressurization and heating are normally carried out under the conditions of molding pressure being 5 to 30 MPa, preferably 10 to 17 MPa, temperature being 130 to 200° C., preferably 150 to 180° C., and time being 10 to 120 seconds, preferably 15 to 60 seconds. In the case of injection-molding, the molding is normally carried out under the conditions of molding pressure being 5 to 100 MPa, preferably 8 to 60 MPa, temperature being 130 to 200° C., preferably 150 to 180° C., and time being 10 to 120 seconds, preferably 15 to 60 seconds. After that, post curing may be added as required in either of the molding methods.

As illustrated in FIG. 6, it becomes possible through the molding as described above to mold a box-type resin package with the inner lead 2 being in the state of its top surface being exposed on the inside bottom surface 14 in the vicinity of the opening 8 and with the outer lead 10 being in the state of its top surface being exposed on the side wall surface 12 of the resin package. Further, the thin resin flashes having formed on the surfaces of the inner lead 2 and the outer lead 10 at the time of molding are removed by applying water under high pressure or the like to them.

Next, a resin package for mounting a solid-state image sensor 1 can be obtained by cutting off the outer lead 10 protruding from the top edge on the outside surface of the side wall 12 of the box-type resin package to separate it from the lead frame 9. It should be noted that the location of cutting the outer lead 10 may be on the farthest peripheral of the resin package at the top edge on the side of the outside surface of the side wall 12 of the box-type resin package or any point beyond the outside of the aforesaid farthest peripheral.

Figure 11:
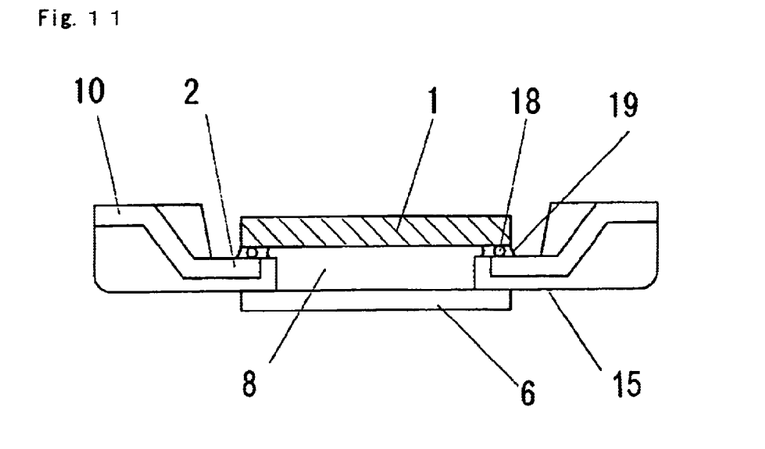
FIG. 11 is a cross sectional view of a device in which a solid-state image sensor has been mounted in the box-type resin package relating to the present invention.

A description will be given below of the procedures for mounting a solid-state image sensor 1 in the box-type resin package for mounting a solid-state image sensor thus obtained as described above. First, a sold-state image sensor 1 having a protruding electrode 18 on the periphery of the image section is mounted face down by use of an electrically conductive adhesive in the location of the exposed section of the inner lead 2 on the inside bottom surface 14 at the opening 8 of the box-type resin package as shown in FIGS. 6, 7 and 8. After that, the clearance between the solid-state image sensor 1 and the inner lead 2 is sealed with sealing liquid-state resin 19. Next, a small and thin device in which a solid-state image sensor 1 is mounted as illustrated in FIG. 11 can be obtained by bonding and fixing a transparent lid 6 on the side of the outside bottom surface 15 at the opening 8 by means of a sealing agent.

Figure 12:
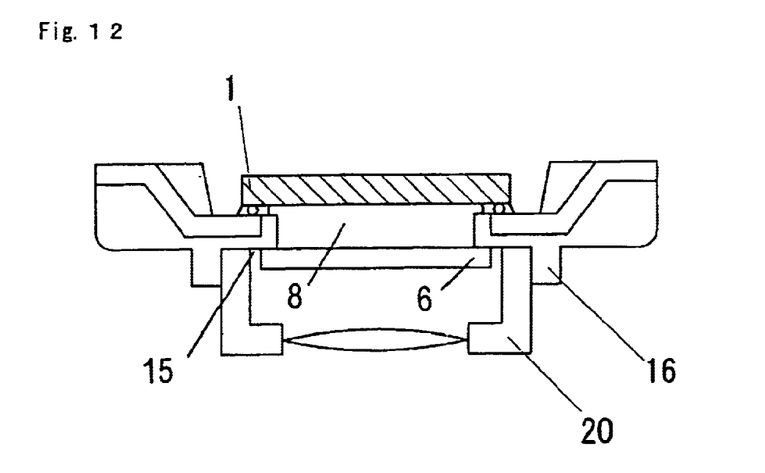
FIG. 12 is a cross sectional view of a solid-state image sensing device mounted in a resin package relating to the present invention which has a cylindrical holder attached to the side of the outside bottom surface at the opening and has a lens and a body tube attached to it.

In the case of a resin package having a holder 16 for mounting a lens tube on the side of the outside bottom surface 15 on the peripheral of the opening of the resin package as shown in FIG. 9, it is also possible to obtain a solid-state image sensor having a lens as an integral part as shown in FIG. 12 by mounting a solid-state image sensor 1 face down, then bonding and fixing a transparent lid 6 on the side of the outside bottom surface 15 at the opening, and subsequently inserting a lens tube 20 into the holder 16. The lens tube 20 may be inside the holder 16 as shown in FIG. 12 or outside the holder 16. In the case of this method, it is also possible to seal the device hermetically by mounting the lens tube 20 with no transparent lid 6 put on the side of the outside bottom surface 15 at the opening 8.

Figure 13:
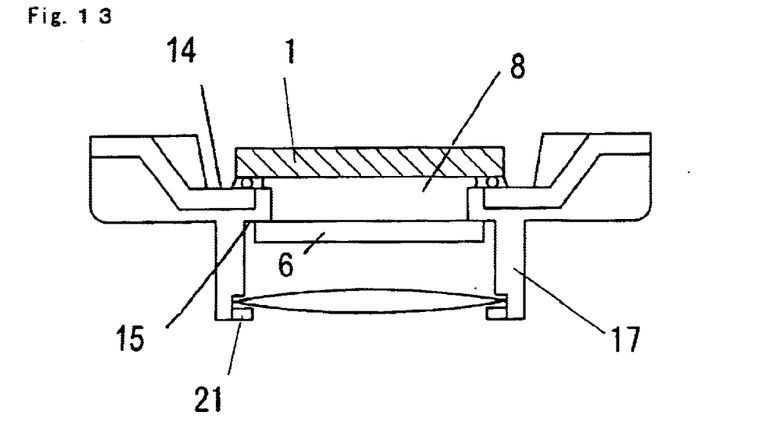
FIG. 13 is a cross sectional view of a solid-state image sensing device mounted in a resin package relating to the present invention which has a body tube attached to the side of the outside bottom surface at the opening and has a lens attached to it.

Furthermore, in the case of a resin package with a body tube 17 for mounting a lens attached on the side of the outside bottom surface 15 on the peripheral of the opening 8 of the resin package as shown in FIG. 10, it is also possible to obtain a solid-state image sensor having a lens as an integral part as shown in FIG. 13 by mounting a solid-state image sensor 1 on the inside bottom surface 14 at the opening 8 in the same manner as described above, then bonding and fixing a transparent lid 6 on the side of the outside bottom surface 15 at the opening 8, and subsequently mounting a lens in the body tube 17. Further, under this method as well as under the method as described above, there may be a transparent lid 6, or no transparent lid 6, on the side of the outside bottom surface 15 at the opening 8. In the case of a resin package having a holder 16 or a body tube 17 on the side of the outside bottom surface 15 at the opening 8, such resin package has an advantage of making the centering of the solid-state image sensor 1 and the lens easy. A module of an image sensor unit can be obtained by joining by soldering the outer lead of the box-type resin package thus obtained and a printed circuit board or a flexible wiring board which serves as a circuit board connecting to the outside.

The present invention can provide inexpensively a resin package for mounting a solid-state image sensor of the face-down mounting type.

The invention has been described with reference to particular embodiments. However, it will be readily apparent to those skilled in the art that it is possible to embody the invention in specific forms other than those of the embodiments described above. This can be done without departing from the spirit of the invention. The embodiments described herein are merely illustrative and should not be considered restrictive in any way. The scope of the invention is given by the appended claims, rather than the preceding description, and all variations and equivalents which fall within the range of the claims are intended to be embraced therein.

What is claimed is:

1. A box-type resin package for mounting a solid state image sensor, comprising:
    a resin section; and
    a lead embedded in the resin section, wherein
        the resin section has a bottom surface with an opening for allowing light to pass, the bottom surface of the resin section being configured to mount a solid state image sensor face down thereon, said lead comprises a conductive metal making electrical conductance possible, and said lead comprises
- an inner lead having a top surface that is exposed at an inside bottom surface of the resin section in the vicinity of the opening,
- an outer lead having a top surface and an edge that are exposed at a side wall top surface of the resin section and a top edge of a side wall side surface of the resin section, respectively, and
- a bent lead section between the inner lead and the outer lead, wherein all parts of the lead other than the exposed surfaces and edge are embedded in the resin section.

2. A box-type resin package for mounting a solid state image sensor as claimed in claim 1, wherein two sides of the resin section are without vertically oriented opposed side walls rising from the inside bottom surface of the resin section and the outer lead protrudes from two other side walls.

3. A box-type resin package for mounting a solid state image sensor as claimed in claim 1, further comprising one of a holder for mounting a lens tube and a body tube for mounting a lens on an outside bottom surface of the resin section in a vicinity of said opening.

4. A box-type resin package for mounting a solid state image sensor as claimed in claim 2, further comprising one of a holder for mounting a lens tube and a body tube for mounting a lens on an outside bottom surface of the resin section in a vicinity of said opening.

* * * * *